(12) United States Patent
Morikawa et al.

(10) Patent No.: US 10,983,548 B2
(45) Date of Patent: Apr. 20, 2021

(54) ELECTRONIC DEVICE

(71) Applicant: Panasonic Intellectual Property Management Co., Ltd., Osaka (JP)

(72) Inventors: Hiroya Morikawa, Osaka (JP); Eiji Saitou, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 125 days.

(21) Appl. No.: 16/301,714

(22) PCT Filed: May 16, 2017

(86) PCT No.: PCT/JP2017/018315
§ 371 (c)(1),
(2) Date: Nov. 14, 2018

(87) PCT Pub. No.: WO2017/204031
PCT Pub. Date: Nov. 30, 2017

(65) Prior Publication Data
US 2019/0121384 A1    Apr. 25, 2019

(30) Foreign Application Priority Data
May 25, 2016  (JP) .............................. JP2016-104721

(51) Int. Cl.
*H05K 7/12*    (2006.01)
*G05G 1/02*    (2006.01)
(Continued)

(52) U.S. Cl.
CPC .............. *G05G 1/02* (2013.01); *G05G 23/00* (2013.01); *G06F 1/183* (2013.01); *H05K 5/0217* (2013.01); *H05K 7/12* (2013.01)

(58) Field of Classification Search
CPC .. H05K 7/12; H05K 5/0217; H01H 2221/044; H01H 2221/016; H01H 13/705;
(Continued)

(56) References Cited

U.S. PATENT DOCUMENTS

| 6,466,769 | B1 | 10/2002 | Kobayashi et al. | |
| 6,914,206 | B2 * | 7/2005 | Mukougawa | H05K 5/0017 200/332 |

(Continued)

FOREIGN PATENT DOCUMENTS

| JP | 58-060976 U | 4/1983 |
| JP | 10-335708 | 12/1998 |

(Continued)

OTHER PUBLICATIONS

Extended European Search Report issued in related European Patent Application No. 17802623.3, dated May 14, 2019.

(Continued)

*Primary Examiner* — Luis A Gonzalez
(74) *Attorney, Agent, or Firm* — McDermott Will & Emery LLP

(57) ABSTRACT

An electronic device includes a housing, and an operation member mounted on an inner surface of the housing. The housing includes a projection inwardly projected from a main surface of the housing and a wall erected on the main surface and having a light guide hole through which light passes. The operation member includes a holding part extending along the main surface from the projection to the wall, an erecting part erected from the holding part along the wall, a transmission part engaged with peripheral edges of the light guide hole while being fitted into the light guide hole and configured to transmit the light, and a receiving part configured to receive a user's operation from an outside of the housing.

4 Claims, 10 Drawing Sheets

(51) Int. Cl.
*H05K 5/02* (2006.01)
*G06F 1/18* (2006.01)
*G05G 23/00* (2006.01)

(58) Field of Classification Search
CPC .. H01H 2003/466; H01H 21/24; H01H 13/14; G05G 1/02; G06F 1/183
See application file for complete search history.

(56) References Cited

U.S. PATENT DOCUMENTS

| | | | |
|---|---|---|---|
| 7,990,695 B2* | 8/2011 | Lv | H01H 3/12 361/679.3 |
| 8,493,742 B2* | 7/2013 | Li | G06F 1/1601 361/752 |
| 9,251,975 B1* | 2/2016 | Brandau | H01H 13/14 |
| 2010/0090847 A1 | 4/2010 | Hendren et al. | |
| 2016/0109112 A1* | 4/2016 | Xiao | G06F 1/183 362/23.04 |

FOREIGN PATENT DOCUMENTS

| | | | |
|---|---|---|---|
| JP | 2000-165064 | | 6/2000 |
| JP | 2000299567 A | * | 10/2000 |
| JP | 2001-085872 | | 3/2001 |
| JP | 2005-191029 | | 7/2005 |
| JP | 2005243399 A | * | 9/2005 |
| JP | 2006-210227 A | | 8/2006 |
| JP | 2008-027714 A | | 2/2008 |
| JP | 2012064436 A | * | 3/2012 |

OTHER PUBLICATIONS

International Search Report of PCT application No. PCT/JP2017/018315 dated Aug. 15, 2017.

* cited by examiner

ELECTRONIC DEVICE

CROSS-REFERENCE TO RELATED APPLICATIONS

This application is a U.S. national stage application of the PCT International Application No. PCT/JP2017/018315 filed on May 16, 2017, which claims the benefit of foreign priority of Japanese patent application No. 2016-104721 filed on May 25, 2016, the contents all of which are incorporated herein by reference.

TECHNICAL FIELD

The present disclosure relates to an electronic device including a housing equipped with an operation member configured to receive an operation by a user and a transmission part configured to transmit light for communication, light for displaying an operation state, or the like.

BACKGROUND ART

An electronic device including an operation member configured to receive an operation by a user from the outside of the housing of the electronic device (hereinafter referred to as a "user's operation") and a transmission part configured to transmit infrared rays for communication, light for displaying an operation state of devices, or the like is required mounting of the operation member and the transmission part on the housing.

For example, PTL 1 discloses a method for mounting an operation member to a housing, in which a pin provided on the housing is inserted into a through hole provided in the operation member and the tip end of the pin projected from the operation member is welded to the housing.

PTL 2 discloses a method for mounting an operation member on a housing, in which one end of the operation member is hooked on an L-shaped projection provided on a main surface of the housing and the other end of the operation member is hooked on claws projected from a wall of the housing.

According to the electronic device in which the operation member is welded to the housing as disclosed in PTL 1, it is necessary to cut the welded portion so as to detach the operation member from the housing. This makes replacement of the operation member alone difficult, and thus replacement of the whole housing is required even in the case where only the operation member is damaged for example. In addition, assembly of such an electronic device requires equipment for welding.

Additional equipment is not required in the case where an electronic device is assembled by the method disclosed in PTL 2 in which an L-shaped projection and claws are provided on a housing, and either end of an operation member is hooked on the projection or the claws to fix the operation member to the housing. In addition, it is possible to detach the operation member from the housing. However, an inclined core or the like is required to provide the housing with the L-shaped projection and the claws by resin molding using a mold. The structure of such a mold becomes more complicated, as the number of the projections and the claws increases. Some molds have a portion where an inclined core cannot be provided, and the projection or the claw cannot be provided to such a portion. PTL 2 also discloses a method of forming an L-shaped projection by providing a hole in the housing. This method enables integrated molding of the L-shaped projection on the housing without using an inclined core. However, the method cannot be employed when a hole in the housing is not desired.

CITATION LIST

Patent Literature

PTL 1: Unexamined Japanese Patent Publication No. 10-335708

PTL 2: Unexamined Japanese Patent Publication No. 2001-085872

SUMMARY

The present disclosure provides an electronic device having a structure capable of fixing an operation member without welding.

The electronic device according to the present disclosure is an electronic device including a housing, and an operation member mounted on an inner surface of the housing. The housing includes a projection inwardly projected from a main surface of the housing and a wall erected on the main surface and having a light guide hole through which light passes. The operation member includes a holding part extending along the main surface from the projection to the wall, an erecting part erected from the holding part along the wall, a transmission part engaged with peripheral edges of the light guide hole while being fitted into the light guide hole and configured to transmit the light, and a receiving part configured to receive a user's operation from an outside of the housing.

The electronic device according to the present disclosure can secure the operation member to the housing without welding. In addition, the electronic device according to the present disclosure eliminates the need for providing the housing with an L-shaped projection or a claw projected from a wall, which requires undercut processing, to fix the operation member.

DESCRIPTION OF EMBODIMENTS

Exemplary embodiments of an electronic device according to the present disclosure are described below with reference to the drawings. However, detailed descriptions that are more than necessary may be omitted. For example, a detailed description of well-known matters and a duplicate description of substantially identical configurations may be omitted. Such omissions are made in order to avoid unnecessary redundancy of the following description and to facilitate understanding of those skilled in the art.

Note that the accompanying drawings and the following description are provided for those skilled in the art to fully understand the present disclosure, and are not intended to thereby limit the subject matter as recited in the appended claims. Note that the following exemplary embodiments simply show examples of the electronic device according to the present disclosure. Therefore, the scope of the present disclosure is defined by the recitations of the claims with the following exemplary embodiments used as references, and the present disclosure is not limited only to the following exemplary embodiments. Thus, among constituent elements in the following exemplary embodiments, constituent elements that are not recited in the independent claim indicating the most generic concepts of the present disclosure are not necessarily essential for achievement of the object of the present disclosure but are described as preferable embodiments.

The drawings are not always exactly illustrated, and are schematic views in which emphasis, omission, and proportional adjustment are made as appropriate for illustration of the present disclosure, and may differ from the actual components in the shapes, positional relationships, and proportions. Further, in the respective drawings, substantially identical constituent elements are denoted by identical reference marks, and descriptions of those components may be omitted or simplified.

Exemplary embodiments of the present disclosure are described below with reference to FIGS. 1 to 10. In the following exemplary embodiments, each of the drawings shows three axes, that is, X-axis, Y-axis, and Z-axis. The X-axis refers to a direction parallel to one side of a housing, the Y-axis refers to a direction parallel to another side orthogonal to the one side of the housing, and the Z-axis refers to a direction orthogonal to both of the X-axis and the Y-axis. However, these axes and directions are shown only for convenience, and do not limit the present disclosure in any way.

First Exemplary Embodiment

[1-1. Configuration]

Figure 1:
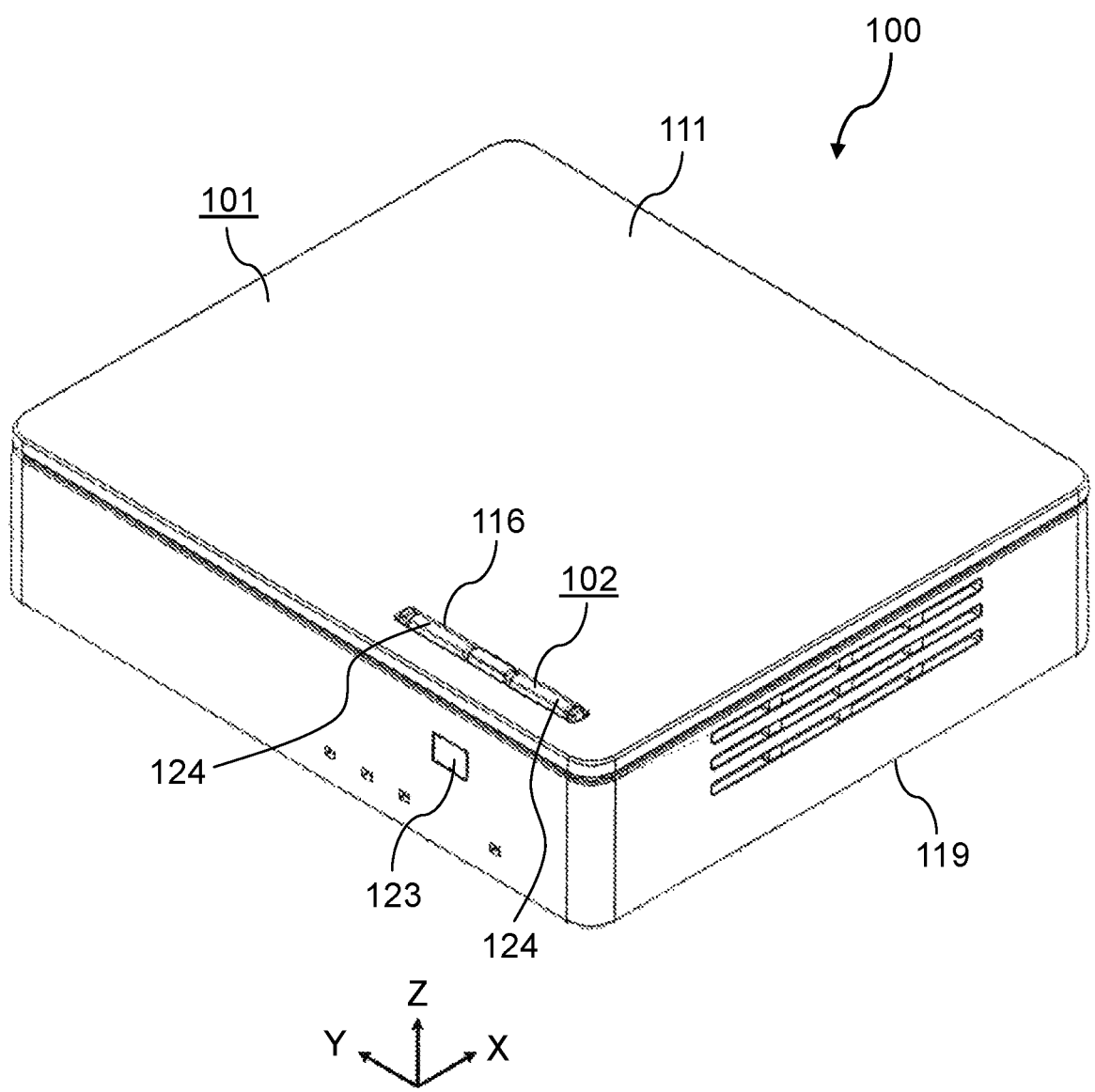
FIG. 1 is a perspective view schematically showing an example of an external appearance of an electronic device according to a first exemplary embodiment.

FIG. 1 is a perspective view schematically showing an example of an external appearance of electronic device 100 according to a first exemplary embodiment.

Electronic device 100 is a device including housing 101, and operation member 102 mounted on an inner surface of housing 101. According to a configuration example of the present exemplary embodiment, electronic device 100 is a device capable of transmitting data such as video contents to external devices by radio waves. Electronic device 100 includes electronic components such as a switch configured to receive a user's operation from the outside, an infrared photodetector, a communication module, a wiring board on which these components are connected, and the like (these are not shown in the figure). These components are mounted on an inside of housing 101.

Housing 101 is a box-shaped member to accommodate the electronic components. According to a configuration example of the present exemplary embodiment, housing 101 includes two members, that is, upper case 111 and lower case 119. At least upper case 111 is formed from resin by using a mold.

Figure 2:
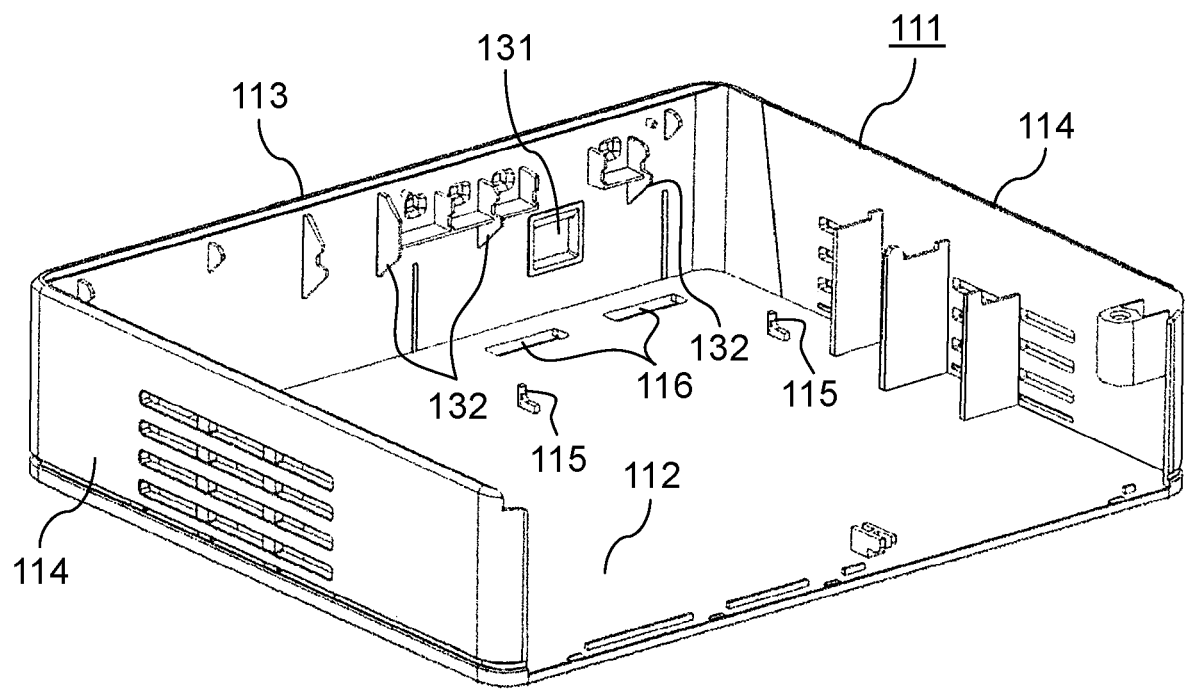
FIG. 2 is a perspective view schematically showing an example of a back side of an upper case of a housing included in the electronic device according to the first exemplary embodiment.
Figure 2:
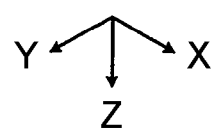

FIG. 2 is a perspective view schematically showing an example of a back side of upper case 111 of housing 101 included in electronic device 100 according to the first exemplary embodiment.

As shown in FIG. 2, upper case 111 that is a part of housing 101 includes main surface 112 that corresponds to an upper surface of electronic device 100, wall 113 that corresponds to a front surface of electronic device 100, and side wall 114 that corresponds to a side surface of electronic device 100.

According to a configuration example of the present exemplary embodiment, main surface 112 is a part having the largest area in upper case 111. Main surface 112 includes projections 115 projected toward the inside of housing 101 (in the negative direction of the Z-axis), and receiving holes 116 formed in a penetrating manner.

Each of projections 115 is a part to be engaged with operation member 102. Projections 115 are integrated with upper case 111 by molding resin using a mold. According to a configuration example of the present exemplary embodiment, each of projections 115 is a part that projects on a back surface of main surface 112 perpendicularly to main surface 112. Each of projections 115 has a shape that can be molded without using an inclined core or without providing a hole in main surface 112. Specifically, each of projections 115 has a shape without a projected portion extending along main surface 112 at a position apart from main surface 112 (i.e., a shape that is not an L-shape), for example, a columnar shape, or a cone or pyramid shape.

Figure 3:
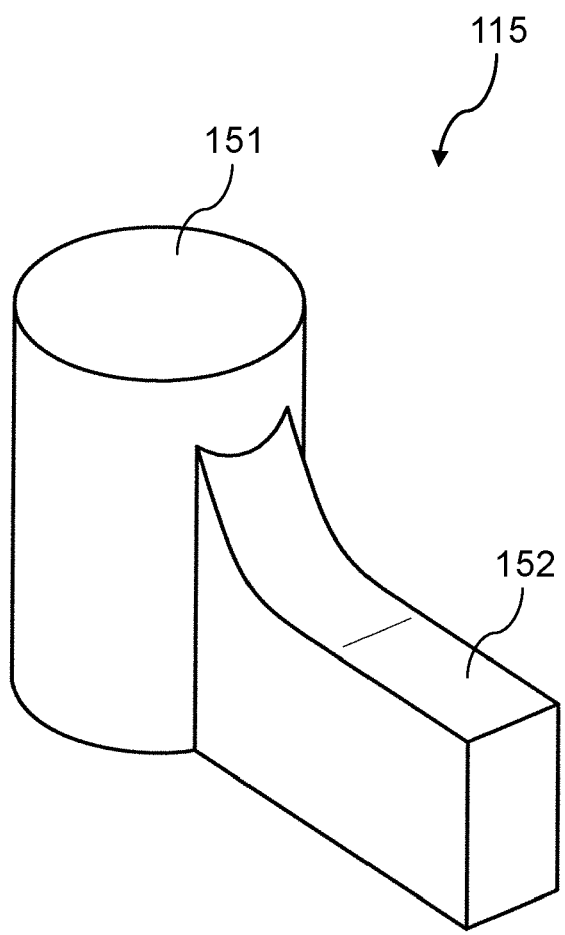
FIG. 3 is a perspective view schematically showing an example of a projection according to the first exemplary embodiment.

FIG. 3 is a perspective view schematically showing an example of projection 115 according to the first exemplary embodiment.

As shown in FIGS. 2 and 3, according to a configuration example of the present exemplary embodiment, each of projections 115 includes columnar part 151 having a shape of a column erected perpendicularly to main surface 112, and rib part 152 provided on a circumferential surface of columnar part 151 at a position opposite to wall 113 and having a substantially parallelepiped-shape that is erected perpendicularly to main surface 112.

Columnar part 151 is a part to be engaged with operation member 102 (described below). Columnar part 151 is provided to determine a position of operation member 102 on upper case 111 in the left and right direction (Y-axis direction) and the anterior-posterior direction (X-axis direction). Rib part 152 is a part to improve structural strength of columnar part 151 so as to resist a pushing force from each of holding parts 121.

Upper case 111 includes a plurality of projections 115 (two projections according to a configuration example of the present exemplary embodiment). The plurality of projections 115 are arranged parallel to a direction along wall 113 (Y-axis direction) on main surface 112.

Each of receiving holes 116 is a through hole provided in main surface 112 of upper case 111 and penetrating main surface 112 of upper case 111. Each of receiving holes 116 receives a part of operation member 102 mounted on an inside of upper case 111.

Wall 113 is a part erected on main surface 112. Wall 113 includes light guide hole 131 through which light passes. According to a configuration example of the present exemplary embodiment, wall 113 is provided at an edge of one end of main surface 112 in a standing state at a right angle to main surface 112.

Light guide hole 131 is a hole that penetrates wall 113 in the thickness direction (X-axis direction) in order to pass light inwardly from the outside of housing 101 or outwardly from the inside of housing 101. According to a configuration example of the present exemplary embodiment, light guide hole 131 is a rectangular hole surrounded by two linear edges that are arranged substantially parallel to main surface 112 and two linear edges that are arranged substantially perpendicularly to main surface 112.

Figure 4:
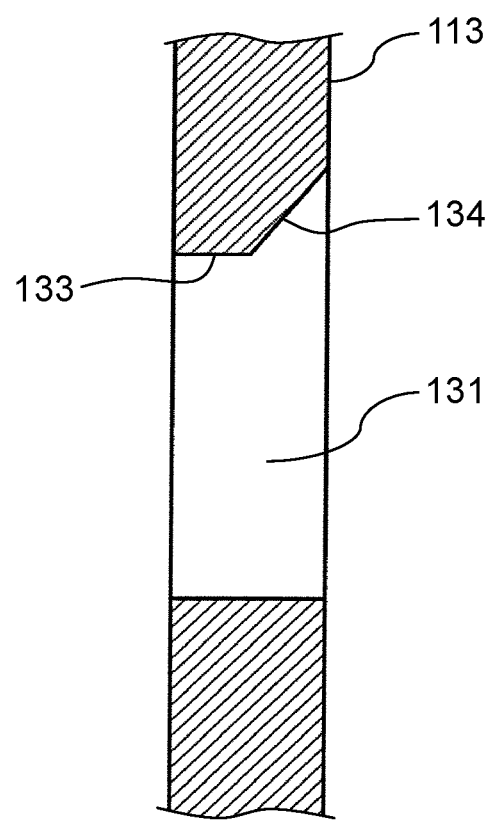
FIG. 4 is a partial sectional view schematically showing an example of a light guide hole according to the first exemplary embodiment.
Figure 4:
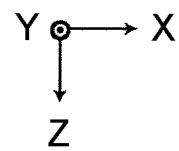

FIG. 4 is a partial sectional view schematically showing an example of light guide hole 131 according to the first exemplary embodiment.

As shown in FIG. 4, light guide hole 131 according to one configuration example of the present exemplary embodiment includes parallel portion 133 and tapered portion 134. Parallel portion 133 is provided on an edge of the peripheral edges of light guide hole 131 so as to be parallel to main surface 112, the edge on which parallel portion 133 is provided is an edge farther from main surface 112 (in the negative direction of the Z-axis) than other edges of the peripheral edges. Tapered portion 134 is provided so as to be gradually distant from main surface 112 (so as to be displaced in the negative direction of the Z-axis) as extending from parallel portion 133 toward the inside of housing 101 (in the positive direction of the X-axis). Parallel portion 133 is a part to be engaged with a side surface of a transmission part (described below). Tapered portion 134 is a part configured to guide a corner of the transmission part when the transmission part is inserted into light guide hole 131.

Figure 5:
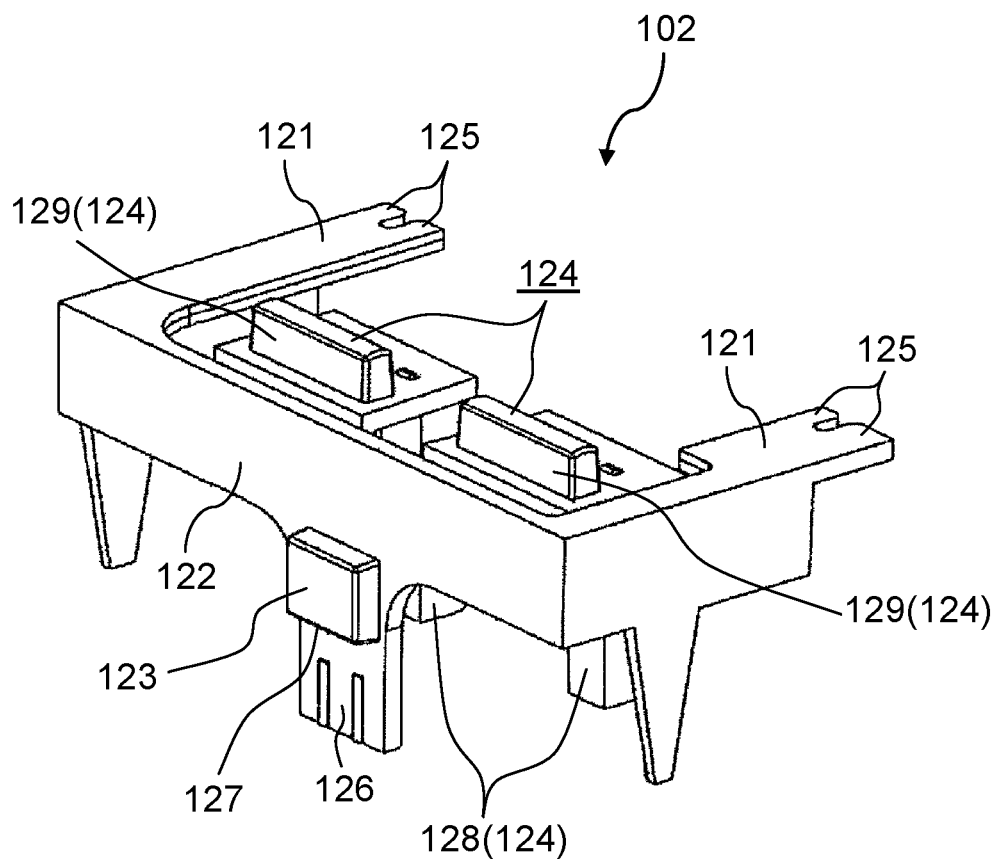
FIG. 5 is a perspective view schematically showing an example of an operation member according to the first exemplary embodiment.

FIG. 5 is a perspective view schematically showing an example of operation member 102 according to the first exemplary embodiment.

Operation member 102 is a member mounted on an inner surface of housing 101 and configured to receive a user's operation from the outside of housing 101. As shown in FIG. 5, operation member 102 includes holding parts 121, erecting part 122, transmission part 123, and receiving parts 124. According to a configuration example of the present exemplary embodiment, operation member 102 further includes regulation parts 125 and rotation prevention part 126.

When holding parts 121 is mounted on the inner surface of housing 101, each of holding parts 121 comes into contact with one of projections 115 at one end and comes into contact with an inner surface of wall 113 at the other end. In this state, each of holding parts 121 is disposed in an area from a corresponding one of projections 115 to wall 113 on main surface 112.

Holding parts 121 respectively include regulation parts 125 at each one end thereof in a projecting manner in a direction opposite to wall 113. Each of regulation parts 125 is a member to position operation member 102. Regulation parts 125 restrict movement of operation member 102 on a plane along main surface 112 in a direction (the left and right direction of upper case 111, the Y-axis direction) intersecting a contact direction between projections 115 and holding parts 121 (the anterior-posterior direction of upper case 111, the X-axis direction). According to a configuration example of the present exemplary embodiment, operation member 102 includes two holding parts 121. Regulation parts 125 are arranged adjacent to each other such that each of regulation parts 125 forms a slit at an end of a corresponding one of holding parts 121.

Erecting part 122 is a part erecting from holding parts 121 along wall 113. Erecting part 122 includes transmission part 123. According to a configuration example of the present exemplary embodiment, erecting part 122 is a plate-shaped part provided along wall 113. Both ends of erecting part 122 respectively include holding parts 121 projecting along main surface 112 (X-Y plane). An intermediate part of erecting part 122 includes transmission part 123 in a projecting manner toward a direction opposite to holding parts 121 (in the negative direction of the X-axis).

Transmission part 123 is a part configured to transmit light. Transmission part 123 is engaged with the peripheral edges of light guide hole 131 while being fitted to light guide hole 131 provided on wall 113 of housing 101. According to a configuration example of the present exemplary embodiment, transmission part 123 is a part that transmits infrared rays from the outside of housing 101 and allows the infrared rays to reach an electronic component (an infrared communication element, for example) disposed in housing 101.

According to a configuration example of the present exemplary embodiment, operation member 102 including transmission part 123, erecting part 122, and holding parts 121 are formed of resin by integral molding. Accordingly, entire operation member 102 is formed of resin that is capable of transmitting infrared rays.

Transmission part 123 illustrated in the present exemplary embodiment as one example is a projected part having a rectangular column shape surrounded by two linear edges that are arranged substantially parallel to main surface 112 and two linear edges that are arranged substantially perpendicularly to main surface 112. Edge 127 that is farthest from main surface 112 among these edges is engaged with light guide hole 131 provided on wall 113.

Rotation prevention part 126 is a part to prevent operation member 102 from falling out of housing 101. Rotation prevention part 126 is provided to extend along wall 113 from transmission part 123 of operation member 102 in a direction opposite to holding parts 121 (in the negative direction of the Z-axis). Rotation prevention part 126 is provided to prevent a situation in which operation member 102 falls out of housing 101 by rotating around the engagement portion between transmission part 123 and light guide hole 131 such that one end of each holding part 121 is detached from projections 115 when operation member 102 is mounted on an inner surface of housing 101. According to a configuration example of the present exemplary embodiment, rotation prevention part 126 is disposed on the same surface as erecting part 122.

Each of receiving parts 124 is a part to receive a user's operation from the outside of housing 101. According to a configuration example of the present exemplary embodiment, receiving parts 124 include buttons 129 and pressing parts 128. Buttons 129 are disposed to penetrate receiving holes 116 provided on main surface 112 of housing 101. Pressing parts 128 are provided to project in a direction opposite to buttons 129 (in the negative direction of the Z-axis), and when force to press is applied to buttons 129, each of pressing parts 128 is configured to transmit the force to a switch disposed in housing 101 to press the switch.

In operation member 102, two receiving parts 124 are arranged parallel to wall 113 between two holding parts 121. Each of receiving parts 124 is mounted on erecting part 122 through a hinge (not shown) that allows receiving part 124 to move in a direction along erecting part 122 (in the Z-axis direction). The hinge allows receiving part 124 to be pressed down (to move in the negative direction of the Z-axis) when a user presses a corresponding one of buttons 129, and has elastic force to return receiving part 124 to the original position after the user stops pressing of button 129. Two receiving parts 124 included in operation member 102 are configured to move independently of each other. Two receiving parts 124 are arranged between holding parts 121 such that transmission part 123 is sandwiched between receiving parts 124. With this configuration, operation member 102 is held in housing 101 in a stable state even when one of receiving parts 124 is receiving a user's operation.

[1-2. Mounting of Operation Member on Upper Case]

Now, steps for mounting operation member 102 configured as shown in FIG. 5 on upper case 111 configured as shown in FIG. 2 will be described.

Figure 6:
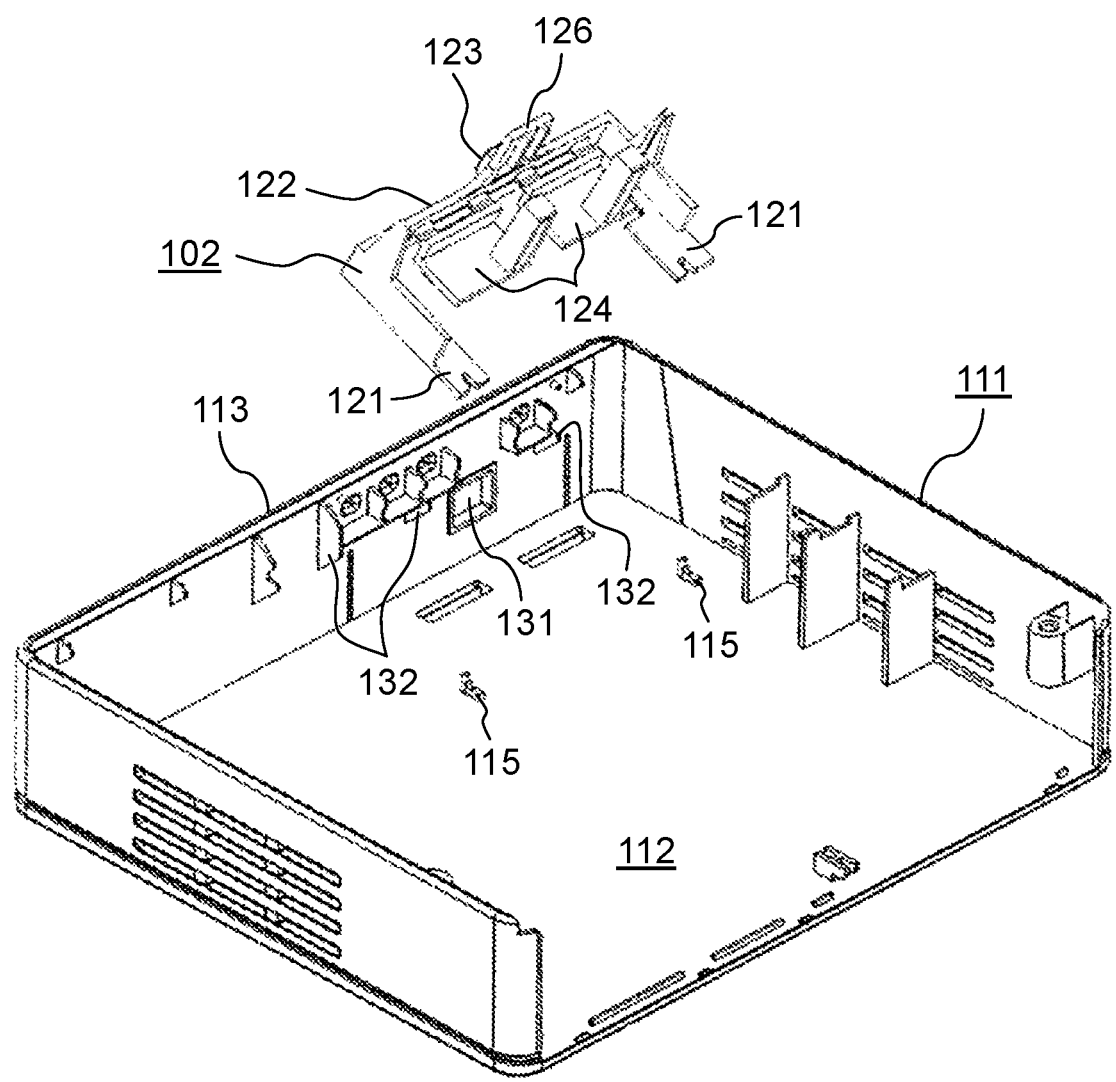
FIG. 6 is a perspective view schematically showing an example of a condition before mounting the operation member on the upper case according to the first exemplary embodiment.

FIG. 6 is a perspective view schematically showing an example of a condition before mounting operation member 102 on upper case 111 according to the first exemplary embodiment.

Figure 7:
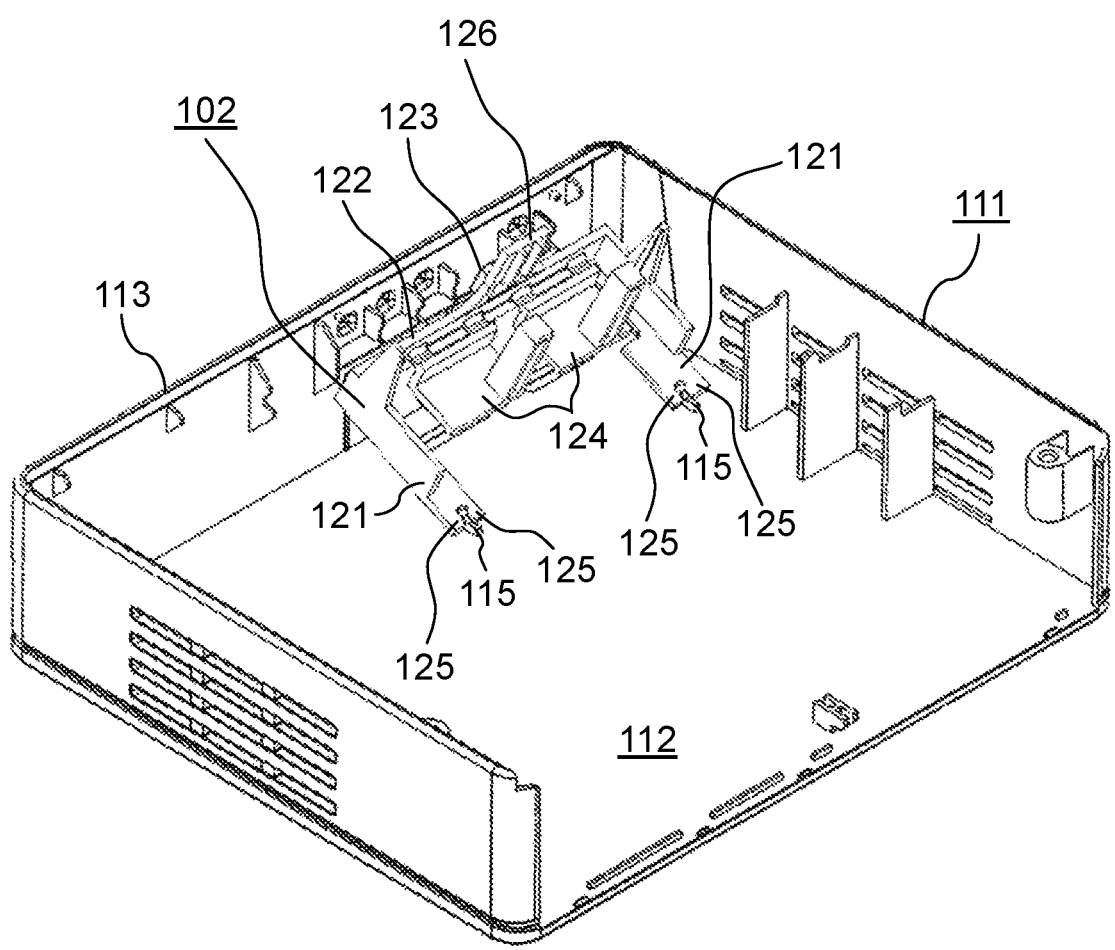
FIG. 7 is a perspective view schematically showing an example of a midway condition of mounting the operation member on the upper case according to the first exemplary embodiment.

FIG. 7 is a perspective view schematically showing an example of a midway condition of mounting operation member 102 on upper case 111 according to the first exemplary embodiment.

Figure 8:
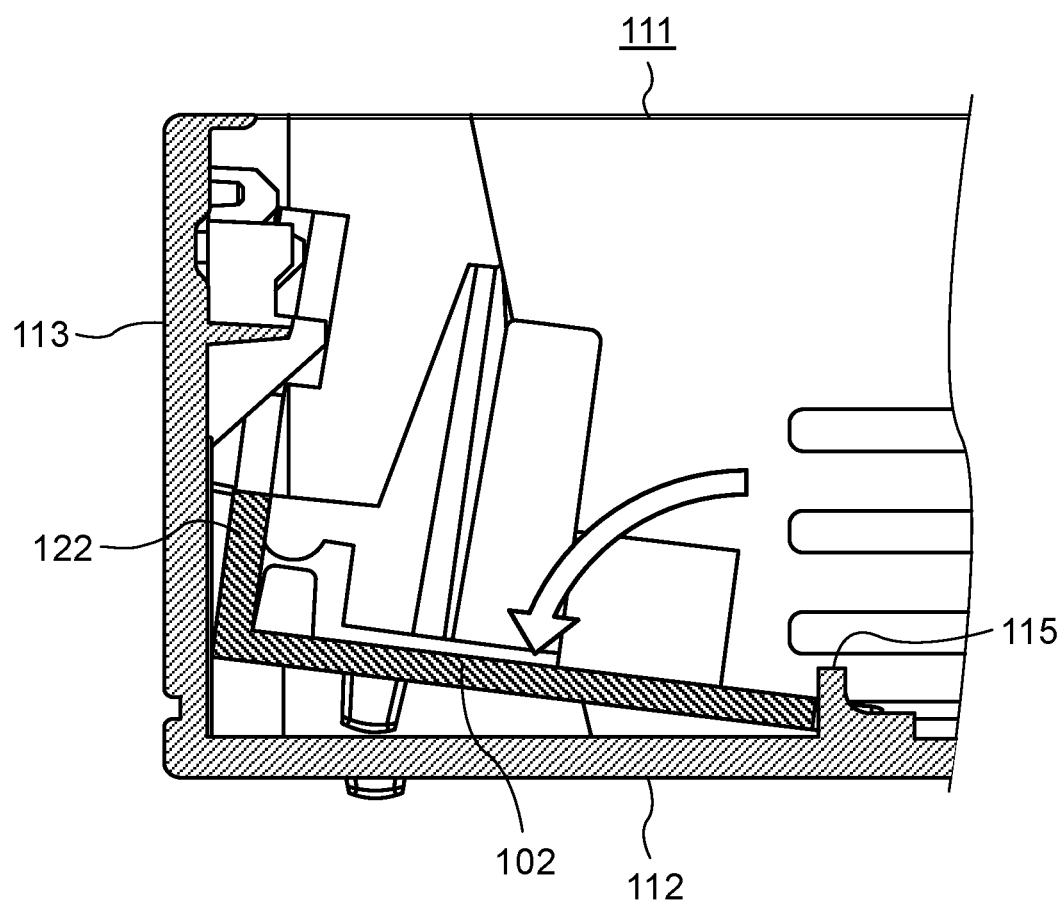
FIG. 8 is a sectional view schematically showing an example of the midway condition of mounting the operation member on the upper case according to the first exemplary embodiment.

FIG. 8 is a sectional view schematically showing an example of the midway condition of mounting operation member 102 on upper case 111 according to the first exemplary embodiment.

Figure 9:
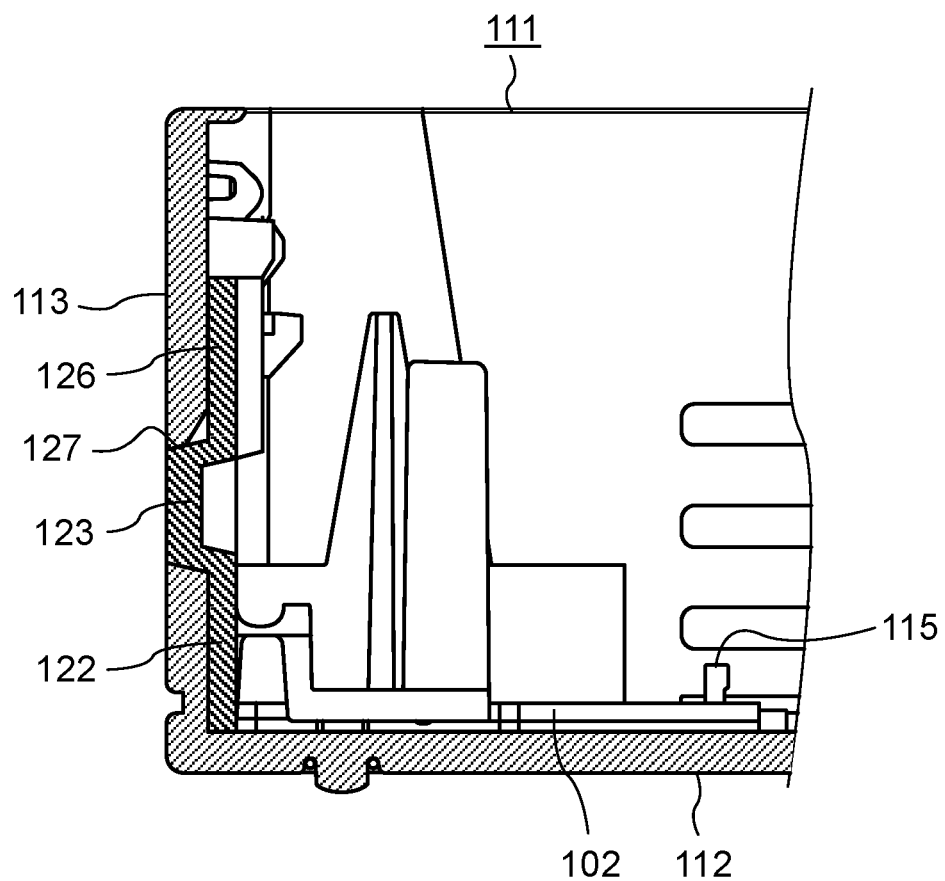
FIG. 9 is a sectional view schematically showing an example of a condition in which the operation member has been mounted on the upper case according to the first exemplary embodiment.

FIG. 9 is a sectional view schematically showing an example of a condition in which operation member 102 has been mounted on upper case 111 according to the first exemplary embodiment.

As shown in FIG. 6, upper case 111 is placed with the back surface of upper case 111 upward, and operation member 102 is turned with the back surface of operation member 102 upward.

From that state, as shown in FIG. 7, holding parts 121 are brought into contact with projections 115 at each one end of holding parts 121 while projections 115 are held by the slits that are formed at regulation parts 125.

As shown by the white arrow in FIG. 8, operation member 102 is rotated around the contact portions between holding parts 121 and respective projections 115 so that erecting part 122 approaches main surface 112 of housing 101. At this time, operation member 102 is slightly elastically deformed into a bent state according to properties of a material of operation member 102, while being guided by tapered portions of guides 132 (see FIG. 6) provided on wall 113.

When operation member 102 is further rotated in the direction of the arrow in FIG. 8, transmission part 123 projected from erecting part 122 toward wall 113 is brought into contact with tapered portion 134 of the edge of light guide hole 131 (see FIG. 4). Transmission part 123 is guided by tapered portion 134 to be inserted into light guide hole 131.

When transmission part 123 is thoroughly inserted into light guide hole 131 as shown in FIG. 9, edge 127 that is farthest from main surface 112 among the edges of transmission part 123 is engaged with an edge that is farthest from main surface 112 among the edges of light guide hole 131 according to elastic force of operation member 102. With this configuration, operation member 102 can be mounted on the inside of housing 101 with a fixed state.

[1-3. Effects and Others]

As described above, the electronic device according to the present exemplary embodiment includes a housing, and an operation member mounted on an inner surface of the housing. The housing includes a projection inwardly projected from a main surface of the housing and a wall erected on the main surface and having a light guide hole through which light passes.

The operation member includes a holding part extending along the main surface from the projection to the wall, an erecting part erected from the holding part along the wall, a transmission part engaged with peripheral edges of the light guide hole while being fitted into the light guide hole and configured to transmit light, and a receiving part configured to receive a user's operation from an outside of the housing.

Electronic device 100 is an example of an electronic device. Housing 101 is an example of a housing. Operation member 102 is an example of an operation member. Main surface 112 is an example of a main surface. Each of projections 115 is an example of a projection. Light guide hole 131 is an example of a light guide hole. Wall 113 is an example of a wall. Each of holding parts 121 is an example of a holding part. Erecting part 122 is an example of an erecting part. Transmission part 123 is an example of a transmission part. Each of receiving parts 124 is an example of a receiving part.

For example, according to an example in the first exemplary embodiment, electronic device 100 includes housing 101, operation member 102 mounted on an inner surface of housing 101. Housing 101 includes projections 115 inwardly projected from main surface 112 of housing 101 and wall 113 erected on main surface 112 and having light guide hole 131 through which light passes. Operation member 102 includes holding parts 121 extending along main surface 112 from projections 115 to wall 113, erecting part 122 erected from holding part 121 along wall 113, transmission part 123 engaged with peripheral edges of light guide hole 131 while being fitted into light guide hole 131 and configured to transmit light, and receiving parts 124 configured to receive a user's operation from the outside of housing 101. In the electronic device, at least one of the projection and an end of the holding part that comes into contact with the projection may include a regulation part configured to restrict relative movement of the projection and the holding part in a direction intersecting the contact direction on a plane along the main surface, the contact direction is a direction in which the at least one of the projection and the end of the holding part comes into contact with the projection.

The anterior-posterior direction of upper case 111 is an example of a contact direction. The left and right direction of upper case 111 is an example of a direction intersecting the contact direction. Each of regulation parts 125 is an example of a regulation part.

According to an example in the first exemplary embodiment, for example, in electronic device 100, at least one of projections 115 and ends of holding parts 121 that come into contact with projections 115 include regulation parts 125 configured to restrict relative movement of projections 115 and holding parts 121 in a direction (the left and right direction of upper case 111, Y-axis direction) intersecting the contact direction (the anterior-posterior direction of upper case 111, X-axis direction) on a plane along main surface 112.

In the electronic device, the operation member may include a rotation prevention part that is disposed on a side opposite to the holding part across the transmission part, and extends along the wall to prevent a situation in which the operation member mounted on the housing rotates and falls out of the housing.

Rotation prevention part 126 is an example of a rotation prevention part.

According to an example in the first exemplary embodiment, for example, in electronic device 100, operation member 102 includes rotation prevention part 126 that is disposed on a side opposite to holding parts 121 across transmission part 123, and extends along wall 113 to prevent a situation in which operation member 102 mounted on housing 101 rotates and falls out of housing 101.

In the electronic device, the light guide hole may include, at an edge of the peripheral edges of the light guide hole, a parallel portion that is parallel to the main surface, and a tapered portion formed to be gradually distant from the main surface as extending inward from the parallel portion, the edge on which the parallel portion and the tapered portion are provided is an edge farther from the main surface than other edges of the peripheral edges.

Parallel portion 133 is an example of a parallel portion. Tapered portion 134 is an example of tapered portion.

According to an example in the first exemplary embodiment, for example, in electronic device 100, light guide hole 131 includes, at an edge of the peripheral edges of light guide hole 131, parallel portion 133 that is parallel to main surface 112, and tapered portion 134 formed to be gradually distant from main surface 112 as extending inward from parallel portion 133, the edge on which parallel portion 133 and tapered portion 134 are provided is an edge farther from main surface 112 than other edges of the peripheral edges.

In electronic device 100 configured as described above, the movement of operation member 102 in a direction away from main surface 112 is restricted by the engagement between light guide hole 131 and transmission part 123. The movement of operation member 102 in a direction away from wall 113 is restricted by the engagement between holding parts 121 and projections 115. The rotational movement of operation member 102 is restricted by rotation prevention part 126. The movement of operation member 102 in a direction along both of main surface 112 and wall 113 is restricted by the engagement between regulation parts 125 and projections 115 and the engagement between light guide hole 131 and transmission part 123. With this configuration, in electronic device 100, operation member 102 is stably fixed to housing 101, and the state in which operation member 102 is stably fixed to housing 101 is maintained even when one of receiving parts 124 is pressed by a user from the outside of housing 101.

In electronic device 100, the engagement between upper case 111 and operation member 102 can be released by applying force to operation member 102 from the back side of upper case 111 to bend operation member 102. With this configuration, operation member 102 can be detached relatively easily from housing 101 in electronic device 100.

In electronic device 100, each of projections 115 for attaching operation member 102 to housing 101 has a shape without an undercut which requires an inclined core or a hole in a housing. In electronic device 100, operation member 102 is mounted on housing 101 utilizing light guide hole 131 provided to transmit light to housing 101. Accordingly, the present exemplary embodiment can simplify a structure of a mold for housing 101 in manufacturing steps of electronic device 100. In other words, housing 101 can be easily formed by resin molding using a mold.

As described above, in an electronic device of the present disclosure (for example, electronic device 100 disclosed in the first exemplary embodiment), a housing (for example, housing 101) for the electronic device can be easily formed by resin molding using a mold. The electronic device of the present disclosure (for example, electronic device 100) can be assembled by relatively easy steps. In addition, the electronic device of the present disclosure (for example, electronic device 100) allows operation member (for example, operation member 102) to be relatively easily detached from housing (for example, housing 101) in the case where repairing or the like is required.

Other Exemplary Embodiments

The first exemplary embodiment has been described above as an example of the technique disclosed in the present disclosure. However, the present disclosure is not limited to the above-mentioned exemplary embodiment. The technique in the present disclosure is also applicable to exemplary embodiments that have undergone changes, replacements, additions, or omissions, for example. For example, new exemplary embodiments can be implemented by arbitrarily combining the constituent elements described in the first exemplary embodiment. In addition, other exemplary embodiments implemented by excluding some of the constituent elements may be exemplary embodiments of the present disclosure. In addition, modifications obtainable by various changes to the above exemplary embodiments that are conceived by those skilled in the art without departing from the essence of the present disclosure, that is to say, the meaning of the recitations in the claims are also included in the present disclosure.

Hence, other exemplary embodiments will be described below.

Figure 10:
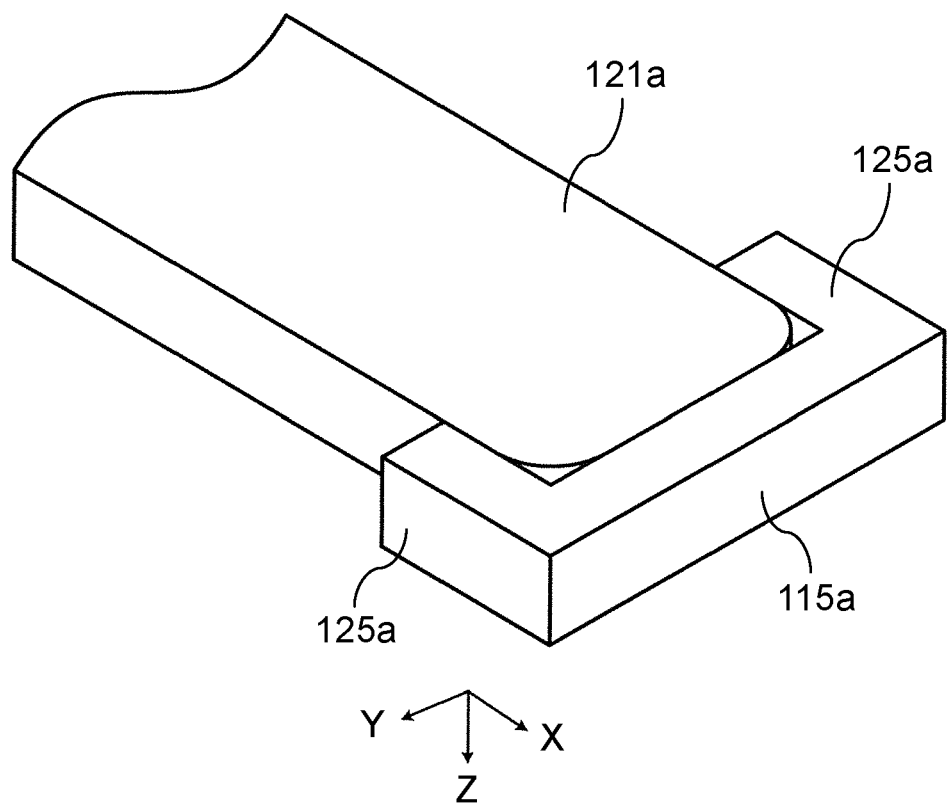
FIG. 10 is a perspective view schematically showing an example of a holding part and a projection of an operation member according to another exemplary embodiment.

FIG. 10 is a perspective view schematically showing an example of holding part 121a and projection 115a of operation member 102 according to another exemplary embodiment. The first exemplary embodiment describes a configuration example in which holding parts 121 of operation member 102 include regulation parts 125 at each one end of holding parts 121. However, as shown in FIG. 10 for example, projection 115a may be equipped with regulation parts 125a to have a C-shape such that holding part 121a is fitted between regulation parts 125a equipped with projection 115a.

The first exemplary embodiment describes electronic device 100 as an independent device having one housing 101. However, the electronic device of the present disclosure is not limited to such an independent electronic device having one housing at all. For example, the electronic device of the present disclosure may be a built-in electronic device that is incorporated in an apparatus such as a vehicle or the like, and a dashboard or the like for a vehicle forms a part or the whole of housing 101.

The first exemplary embodiment describes a configuration example in which operation member 102 includes receiving part 124 that is physically pressed down by a user. However, the present disclosure is not limited at all to this configuration example. Receiving parts 124 may be any parts that can receive an external input by a user, and may be a proximity sensor or a touch sensor, for example.

As described above, the exemplary embodiments have been described as an example of a technique according to the present disclosure. The accompanying drawings and the detailed description have been provided for this purpose.

Accordingly, the constituent elements described in the accompanying drawings and the detailed description may include not only constituent elements that are essential to solve the problem but also constituent elements that are provided as examples used to exemplify the technique and are not essential to solve the problem. For this reason, those nonessential constituent elements that are illustrated in the accompanying drawings or described in the detailed description should not be construed as essential.

The above exemplary embodiments are provided to exemplify the technique according to the present disclosure, and thus various changes, replacements, additions, omissions, and the like can be made within the scope of the claims and equivalents thereof.

INDUSTRIAL APPLICABILITY

An electronic device according to the present disclosure can be applied to various apparatuses having an operation member.

REFERENCE MARKS IN THE DRAWINGS

100: electronic device
101: housing
102: operation member
111: upper case
112: main surface
113: wall
114: side wall
115, 115a: projection
116: receiving hole
119: lower case
121, 121a: holding part
122: erecting part
123: transmission part
124: receiving part
125, 125a: regulation part
126: rotation prevention part
127: edge
128: pressing part
129: button
131: light guide hole
132: guide
133: parallel portion
134: tapered portion
151: columnar part
152: rib part

The invention claimed is:

1. An electronic device comprising:
a housing; and
an operation member mounted on an inner surface of the housing,
wherein the housing includes:
a projection inwardly projected from a main surface of the housing; and
a wall erected on the main surface and having a light guide hole through which light passes, and
wherein the operation member includes:
a holding part extending along the main surface from the projection to the wall;
an erecting part erected from the holding part along the wall;
a transmission part engaged with peripheral edges of the light guide hole while being fitted into the light guide hole and configured to transmit the light; and
a receiving part configured to receive an operation by a user from an outside of the housing, wherein the receiving part is located in a receiving hole in the main surface of the housing.

2. The electronic device according to claim 1, wherein at least one of the projection and an end of the holding part that comes into contact with the projection includes a regulation part configured to restrict relative movement of the projection and the holding part in a direction intersecting a contact direction on a plane along the main surface.

3. An electronic device, comprising:
a housing; and
an operation member mounted on an inner surface of the housing,
wherein the housing includes:
a projection inwardly projected from a main surface of the housing; and
a wall erected on the main surface and having a light guide hole through which light passes,
wherein the operation member includes:
a holding part extending along the main surface from the projection to the wall;
an erecting part erected from the holding part along the wall;
a transmission part engaged with peripheral edges of the light guide hole while being fitted into the light guide hole and configured to transmit the light; and
a receiving part configured to receive an operation by a user from an outside of the housing, and
wherein the operation member includes a rotation prevention part that is disposed on a side opposite to the holding part across the transmission part, and extends along the wall to prevent a situation in which the operation member mounted on the housing rotates and falls out of the housing.

4. An electronic device, comprising:
a housing; and
an operation member mounted on an inner surface of the housing,
wherein the housing includes:
a projection inwardly projected from a main surface of the housing; and
a wall erected on the main surface and having a light guide hole through which light passes,
wherein the operation member includes:
a holding part extending along the main surface from the projection to the wall;
an erecting part erected from the holding part along the wall;
a transmission part engaged with peripheral edges of the light guide hole while being fitted into the light guide hole and configured to transmit the light; and
a receiving part configured to receive an operation by a user from an outside of the housing, and
wherein the light guide hole includes at an edge of the peripheral edges of the light guide hole,
a parallel portion that is parallel to the main surface; and
a tapered portion formed to be gradually distant from the main surface as extending inward from the parallel portion, wherein the edge on which the parallel portion and the tapered portion are provided is farther from the main surface than other edges of the peripheral edges.

* * * * *